United States Patent
Boemmels et al.

(10) Patent No.: US 8,404,577 B2
(45) Date of Patent: Mar. 26, 2013

(54) SEMICONDUCTOR DEVICE HAVING A GRAIN ORIENTATION LAYER

(75) Inventors: Juergen Boemmels, Dresden (DE); Matthias Lehr, Dresden (DE); Ralf Richter, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 512 days.

(21) Appl. No.: 12/035,518

(22) Filed: Feb. 22, 2008

(65) Prior Publication Data
US 2009/0035936 A1    Feb. 5, 2009

(30) Foreign Application Priority Data
Jul. 31, 2007 (DE) .................. 10 2007 035 837

(51) Int. Cl.
H01L 21/44 (2006.01)

(52) U.S. Cl. ........ 438/597; 438/622; 438/637; 438/672; 438/675; 257/377; 257/758; 257/759; 257/761; 257/762

(58) Field of Classification Search .................. 438/597
See application file for complete search history.

(56) References Cited

U.S. PATENT DOCUMENTS

| | | | | |
|---|---|---|---|---|
| 5,576,241 A * | 11/1996 | Sakai | ............................. | 438/404 |
| 5,668,055 A * | 9/1997 | Xu et al. | ....................... | 438/637 |
| 5,695,810 A * | 12/1997 | Dubin et al. | ................... | 438/643 |
| 5,943,601 A * | 8/1999 | Usui et al. | ..................... | 438/688 |
| 6,043,153 A * | 3/2000 | Nogami et al. | ............... | 438/687 |
| 6,147,408 A * | 11/2000 | Ogure et al. | .................. | 257/762 |
| 6,207,558 B1 * | 3/2001 | Singhvi et al. | ................ | 438/648 |
| 6,215,188 B1 * | 4/2001 | DeSilva | ........................ | 257/773 |
| 6,261,963 B1 * | 7/2001 | Zhao et al. | .................... | 438/704 |
| 6,391,774 B1 * | 5/2002 | Takewaki | ...................... | 438/687 |
| 6,444,567 B1 * | 9/2002 | Besser et al. | .................. | 438/625 |
| 6,613,667 B1 * | 9/2003 | Kuo | .............................. | 438/637 |
| 6,974,769 B2 * | 12/2005 | Basol et al. | .................... | 438/627 |
| 7,008,871 B2 * | 3/2006 | Andricacos et al. | .......... | 438/652 |
| 7,193,323 B2 * | 3/2007 | Cabral et al. | ................... | 257/751 |
| 7,372,165 B2 * | 5/2008 | Dubin et al. | ................... | 257/774 |
| 7,476,611 B2 * | 1/2009 | Kunishima et al. | ........... | 438/637 |

(Continued)

FOREIGN PATENT DOCUMENTS

| DE | 100 53 915 C2 | 11/2002 |
|---|---|---|
| DE | 103 44 389 A1 | 5/2005 |

(Continued)

OTHER PUBLICATIONS

Jun. 4, 2008 letter from foreign associate forwarding official communication issued Apr. 24, 2008.

(Continued)

*Primary Examiner* — N Drew Richards
*Assistant Examiner* — Ankush Singal
(74) *Attorney, Agent, or Firm* — Williams, Morgan & Amerson, P.C.

(57) ABSTRACT

A manufacturing process of a semiconductor device includes generating a less random grain orientation distribution in metal features of a semiconductor device by employing a grain orientation layer. The less random grain orientation, e.g., a grain orientation distribution which has a higher percentage of grains that have a predetermined grain orientation, may lead to improved reliability of the metal features. The grain orientation layer may be deposited on the metal features wherein the desired grain structure of the metal features may be obtained by a subsequent annealing process, during which the metal feature is in contact with the grain orientation layer.

10 Claims, 5 Drawing Sheets

U.S. PATENT DOCUMENTS

| | | | |
|---|---|---|---|
| 2002/0146881 A1 | 10/2002 | Joo et al. | 438/240 |
| 2003/0124828 A1 | 7/2003 | Lu et al. | 438/600 |
| 2004/0259378 A1* | 12/2004 | Chambers et al. | 438/771 |
| 2005/0095847 A1* | 5/2005 | Kunishima et al. | 438/637 |
| 2005/0104216 A1* | 5/2005 | Cabral et al. | 257/758 |
| 2005/0127518 A1* | 6/2005 | Cabral et al. | 257/768 |
| 2005/0153548 A1* | 7/2005 | Hong | 438/687 |
| 2005/0186793 A1* | 8/2005 | Omoto et al. | 438/687 |
| 2006/0202345 A1 | 9/2006 | Barth et al. | 257/761 |
| 2007/0080459 A1* | 4/2007 | Seok | 257/751 |
| 2007/0096319 A1* | 5/2007 | Hsu et al. | 257/750 |
| 2007/0238294 A1* | 10/2007 | Beyer et al. | 438/687 |

FOREIGN PATENT DOCUMENTS

| | | |
|---|---|---|
| GB | 1 845 554 A2 | 12/2006 |
| KR | 1020070070561 A | 7/2007 |

OTHER PUBLICATIONS

Translation of Official Communication Issued Apr. 24, 2008.
Translation of Official Communication from German Patent Office for German Patent Application No. 10 2007 035 837.9-33 dated Jun. 22, 2010.

* cited by examiner

SEMICONDUCTOR DEVICE HAVING A GRAIN ORIENTATION LAYER

BACKGROUND OF THE INVENTION

1. Field of the Invention

The present invention generally relates to the formation of integrated circuits, and, more particularly, to the fabrication of highly conductive metal features.

2. Description of the Related Art

In modern integrated circuits, a high number of individual circuit elements, such as transistors, capacitors, resistors and the like, are formed in and on an appropriate substrate, typically in a substantially planar arrangement. The electrical connections between the circuit elements may not be provided within the same level, as the number of connections is usually significantly higher than the number of circuit elements. Consequently, one or more wiring levels or layers are provided which include the metal lines and metal regions establishing the electrical connections within a specified level (considered as inner-level connections) and the vias connecting metal lines or regions in different levels (considered as inter-level connections). A wiring layer is typically referred to as a metallization layer, wherein, depending on terminology, a metallization layer may also be understood as containing one layer having formed therein the wires providing the inter-level to one adjacent metal line layer. Herein, a metallization layer comprises at least one of a metal line layer, i.e., inner-level connections, and a via layer, i.e., inter-level connections. The metallization layers, and in particular the metal features of a semiconductor device, may be considered as a wiring network having a lower end in the form of a metal line layer that comprises a complex structure to connect to respective contact plugs directly terminating at circuit elements and having an upper end in the form of a metal line layer of reduced complexity to provide the electrical connections to the periphery, that is, to a carrier substrate or a package. The wiring network with the intermediate metal line layers and via layers and the upper and lower contact ends thus provides the electrical connections in accordance with the electrical design of the one or more circuits provided in a respective chip.

While aluminum is a well-approved metal in the semiconductor industry, in modern integrated circuits, highly conductive metals, such as copper and alloys thereof, are increasingly used to accommodate the high current densities encountered during the operation of the devices, as the ongoing reduction of feature sizes also leads to reduced dimensions of the metal lines and vias. Consequently, the metal features may comprise metal lines and vias formed from copper or copper alloys.

Copper and copper-based alloys are attractive for use in semiconductor devices requiring multi-level metallization systems for back-end processing of the semiconductor wafers on which the devices are based. Copper and copper alloy based metallization systems have very low resistivities, i.e., significantly lower than that of tungsten and even lower than aluminum and its alloys. Further, copper and copper alloy based metallization systems have a high resistance to electromigration. In order to improve the electromigration behavior of the copper and copper alloy based metal features, it has been suggested to cover the surface of a respective metal feature with a cobalt-based, e.g., a cobalt tungsten phosphide (CoWP) or a cobalt tungsten boride (CoWB) capping layer. Moreover, copper and it's alloys can be readily deposited at low temperatures in good quality by well-known wet plating techniques, such as electroless and electroplating techniques, at deposition rates fully compatible with the requirements of device manufacturing throughput.

Electroless plating of copper generally involves the controlled auto-catalytic deposition of a continuous film of copper or an alloy thereof on a catalytic surface by the incorporation of at least one copper-containing salt and a chemical reducing agent contained in a suitable solution. Electroplating comprises employing electrons supplied to an electrode which comprises the surface to be plated from an external source, e.g., a power supply, for reducing copper ions in solution and depositing reduced copper metal atoms on the plating surface. In either case, a nucleation/seed layer is required for catalyzes and/or deposition on the substrate. Finally, while electroplating requires continuous nucleation/seed layer, very thin and discontinuous islands of catalytic metal may be employed with electroless plating.

Since copper and copper based alloys are relatively difficult to etch, at least at low temperatures, copper wirings are typically formed as an "in-laid" metallization pattern by a so-called damascene technology. Generally, in damascene technology, a recess, e.g., a via hole in a dielectric layer for electrically connecting vertically separated metal features, or a groove or trench for a metal line, is created in a dielectric layer by conventional photolithographic and etching techniques, and filled with a selected material. Any excess metal overfilling the recess and/or extending over the surface of the dielectric layer is then removed by planarizing, e.g., chemical mechanical polishing (CMP), wherein a moving pad is biased against a surface to be polished/planarized with the interposition of an appropriate slurry therebetween.

A variant of the above-described single damascene technique involves the formation of an opening comprising a lower contact or a via hole section in communication with an upper groove or trench section. The opening is filled with a conductive material, typically a metal, to simultaneously form a conductive via plug in electrical contact with a conductive line. A process of this kind is referred to as a dual damascene process.

In a damascene process, at first the desired arrangement of conductors is defined as a pattern of recesses, such as via holes, grooves, trenches, etc., formed in a dielectric layer by conventional photolithographic and etching techniques. Subsequently, an adhesion promoting and/or diffusion barrier layer is formed in the recesses in the dielectric layer. Suitable materials for such an adhesion/barrier layer include, e.g., titanium, tungsten, chromium, tantalum and tantalum nitride.

With reference to FIG. 1, a typical conventional process flow will now be described to explain the principles of the damascene process in more detail. FIG. 1 schematically shows a semiconductor device 100 that is formed in accordance with a conventional technique, including a metallization layer stack on the basis of copper. The semiconductor device 100 comprises a substrate 101, which is to represent any appropriate substrate for the formation of circuit elements therein and thereon, wherein, for convenience, any such circuit elements are not shown. Formed above the substrate 101 are one or more metallization layers, including respective metal features, e.g., vias and metal lines, as is explained above. For clarity reasons, a portion of one metallization layer 110 is illustrated in FIG. 1, on which is formed a second metallization layer 120. The metallization layer 110 may comprise a metal line layer of which is shown a metal line 112 that is covered by a dielectric barrier and etch stop layer 111. For example, the metal line 112 may represent a copper-based metal line which is to be understood as a line in which a substantial portion is copper. It should be appreciated that other materials may be contained in the metal line 112, such as conductive barrier materials and the like, as well as other metals for forming a copper alloy, for instance at specific areas within the metal line 112, wherein it should be understood that, nevertheless, a significant amount, that is, more than approximately 50 atomic percent of the material of the line 112 is copper. The barrier and etch stop layer 111 may be comprised of any appropriate dielectric materials, such as silicon nitride, silicon carbide, nitrogen-enriched silicon carbide and the like. The second metallization layer 120 may comprise a via layer 122 which may comprise an appropriate dielectric material 127, also referred to as interlayer dielectric material (ILD), in which is formed a via 113 that is substantially comprised of copper, wherein, for instance, a conductive barrier layer 125 may provide the required adhesion and diffusion blocking characteristics. Typical materials for the barrier layer 125 are tantalum, tantalum nitride, titanium, titanium nitride and the like. The last metallization layer 120 further comprises a further metal line layer 121 which may comprise an appropriate interlayer dielectric material, such as the material 127, which may be comprised of any appropriate materials, such as silicon dioxide, silicon nitride and the like. In sophisticated applications, the interlayer dielectric material of the metal line layer 121 may comprise a low-k dielectric material having a relative permittivity of 3.0 or even less. In the dielectric material 127 is formed a copper-based metal line 124, which may also be separated from the interlayer dielectric material 127 by a barrier layer 125.

A typical process flow for forming the semiconductor device 100 as shown in FIG. 1 may comprise the following processes. After the formation of any circuit elements and respective metallization layers, the metallization layer 110 may be formed on the basis of well-established single or dual damascene or inlaid techniques in which a dielectric layer may be deposited first and may be subsequently patterned to receive via openings or trenches which may then, commonly or separately, be filled with the copper-based material. For example, the metallization layer 110 may be formed by depositing an appropriate dielectric material, such as a low-k material, which is subsequently patterned to receive first vias and trenches or to receive first trenches and then vias, which are subsequently coated with an appropriate barrier material, wherein subsequently copper may be filled in by electroplating or any other appropriate deposition technique. In damascene regimes, a via layer may be formed first and subsequently the interlayer dielectric material may be deposited in an appropriate thickness to form therein trenches for receiving the metal line 112.

Thereafter, the barrier layer 111 may be formed on the basis of well-established plasma enhanced chemical vapor deposition (PECVD) techniques. Thereafter, the second metallization layer 120 may be formed. For convenience, in the following process flow, it may be assumed that the via layer 122 and the metal line layer 121 may be formed in accordance with a dual inlaid technique in which corresponding via openings are formed first and subsequently trenches are etched into the dielectric layer. Subsequently, the via opening and the trench are filled in a common process sequence. Consequently, the interlayer dielectric material 127 may be formed on the basis of any appropriate technique, such as PECVD, spin-on techniques, or any combination thereof, wherein, in some regimes, an intermediate etch stop layer may be provided to separate the via layer 122 from the metal line layer 121. In other approaches, the interlayer dielectric material 127 may be provided as a substantially continuous layer.

Thereafter, respective via openings may be formed throughout the entire layer 127 by providing a corresponding resist mask and etching through the layer 127, wherein the barrier etch stop layer 111 may be used to reliably stop the corresponding isotropic etch process. Thereafter a further resist mask may be formed and corresponding trenches may be etched into the layer 127 in accordance with dimensions required for the metal line 124. After removal of the resist mask and any other resist material or polymer material required for the second etch step, the etch stop layer 111 may be opened to connect the respective via opening with the underlying metal line 112. Thereafter, the barrier layer 125 may be formed and thereafter copper may be deposited into the respective structure, thereby forming the via 113 and the metal line 124 in a common deposition process. In order to ensure complete filling of the recess, the copper-containing layer is deposited as a blanket or overburden layer of excess thickness so as to overfill the recesses and cover the upper surface of the dielectric layer 127. The entire excess thickness of the metal overburden layer over the surface of the dielectric layer 127 is removed by a planarizing process, e.g., a CMP process, leaving metal portions in the recesses with their exposed upper surfaces substantially coplanar with the surface of the dielectric layer 127.

A drawback associated with the use of copper or copper-based metallurgy for metallization processes of semiconductor devices, e.g., back-end metallization processes, results from the undesirable formation of copper oxide on the planarized copper or copper-based surfaces of the inlaid metallization features as a result of oxidation, e.g., due to the strong chemical oxidizing agents conventionally included in CMP slurries for enhancing copper dissolution/removal rates or as a result of exposure of the freshly abraded copper-based surfaces to an oxidizing atmosphere, for instance, air or oxygen. The thickness of the copper oxide layer may vary depending on the particular CMP processing conditions, for instance, stronger oxidizing agents contained in the CMP slurry result in thicker oxide layers. In order to reduce the adverse effects of copper oxide, it has been proposed to deposit a metallic passivant element for passivating the copper surface and subsequently effecting reaction between the metallic passivant element and the copper surface to form a passivating layer, thereby improving the electromigration behavior of the respective copper line.

Electromigration occurs in extended runs or lengths of metal conductor lines carrying significant currents. According to a conventional theory for explaining the mechanism of electromigration, the current flow within the conductor line may be sufficient to result in movement of metal, for instance, copper, atoms and/or ions along the line by means of momentum transfer due to collision of the metal atoms and/or ions with energetic, flowing electrons. The current flow may also create a thermal gradient along the conductor length which increases the mobility of the metal atoms and/or ions. As a consequence of the momentum transfer and the thermally enhanced mobility, metal atoms and/or ions diffuse in the direction of the current flow and metal loss at the source end of the conductor eventually results in thinning of the conductor line. The electromigration effect may continue until the conductor line becomes so thin that it separates from the current input and forms an open circuit, resulting in failure of the integrated circuit. As this usually occurs over an extended period of operation, the failure is often seen by the end user.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to providing a technique of processing metal features of an existing metallization layer, e.g., copper interconnects, so as to obtain a less random grain orientation in the metal features. For this purpose, a grain orientation layer in combination with appropriate annealing is used for aligning grains in the metal feature. Consequently, in the metal feature, an increased amount of grains having a predominant grain orientation may be achieved.

One illustrative method comprises providing a substrate having a metallization layer with at least one metal feature and forming a grain orientation layer above the metal feature and in contact with the metal feature, wherein the grain orientation layer energetically favors a predetermined grain orientation of grains in the metal feature compared to other grain orientations of grains in the metal feature. The method further comprises annealing the metal feature to thereby increase a percentage of grains in the metal feature which have the predetermined grain orientation.

Another illustrative method comprises generating a predetermined grain orientation distribution in a metal feature of a semiconductor device by depositing a grain orientation layer on the metal feature, wherein the grain orientation layer energetically favors a predetermined grain orientation of grains in the metal feature compared to other grain orientations in the metal feature, and subsequently annealing the metal feature.

A still further illustrative method comprises generating, compared to an initial grain orientation distribution, a less random grain orientation distribution in a metal feature of a semiconductor device by employing a grain orientation layer, wherein the less random grain orientation distribution has a higher percentage of grains oriented in a predetermined direction than the initial grain orientation distribution.

BRIEF DESCRIPTION OF THE DRAWINGS

The disclosure may be understood by reference to the following description taken in conjunction with the accompanying drawings, in which like reference numerals identify like elements, and in which.

Figure 1:
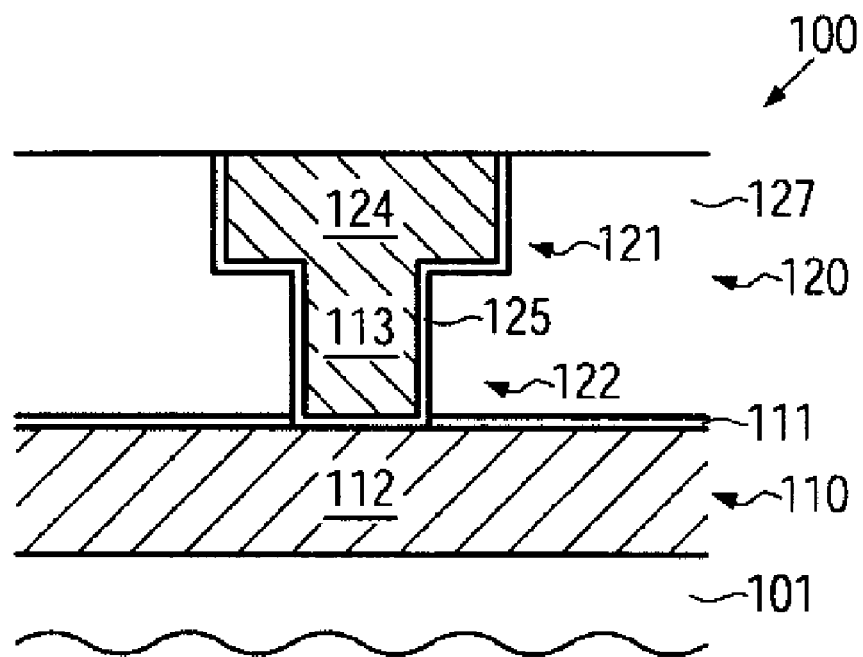
FIG. 1 schematically shows a cross-sectional view of a conventional semiconductor device including a copper-based metallization layer stack.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The grain orientation of small metal features in metallization layers, e.g., copper interconnects, has been found to be usually highly random. Further, such randomness in grain orientation has been found to have a negative impact on the reliability of the metal feature, e.g., the copper interconnects.

An illustrative method comprises reducing randomness of grain distribution in a metal feature of a semiconductor device by employing a grain orientation layer. A change in the grain distribution of the metallization may be initiated by annealing at elevated temperatures or by any other energy depositing process, i.e., exposure to ultrasonic sound, pressure, etc. A further illustrative method comprises generating a predetermined grain orientation distribution in a metal feature of a semiconductor device by depositing a grain orientation layer over the metal feature and subsequently annealing the metal feature. Predetermined grain orientation in this sense denotes a grain orientation that is predetermined by the respective grain orientation layer and optionally other layers that have an impact on the grain orientation of the metal feature after annealing. A further illustrative method comprises forming a grain orientation layer above a metal feature of a semiconductor device and in contact with the metal feature. Subsequently, the metal feature is annealed to thereby produce non-random grain orientation or, if the metal feature already exhibits an initial non-randomness in grain orientation, a more non-random grain orientation in the metal feature. According to illustrative embodiments, the grain orientation layer energetically favors a predetermined grain orientation of grains in the metal feature compared to other grain orientations in the metal feature. According to other illustrative embodiments, by annealing of the metal feature in contact with the metal feature, a percentage of grains in the metal feature which have the predetermined grain orientation is increased.

According to illustrative embodiments, the metal feature comprises copper. For instance, the metal feature may essentially consist of copper or may be a copper alloy. For example, the metal feature may comprise at least 50 atomic percent copper.

According to an illustrative embodiment, the grain orientation layer is a metal layer. For instance, the grain orientation layer may consist of or comprise at least one of the following metals: copper alloys, copper-aluminum (Cu—Al), tantalum (Ta), tantalum nitride (TaN), titanium (Ti), titanium nitride (TiN), tungsten (W), tungsten nitride (WN), cobalt (Co) or ruthenium (Ru). According to another illustrative embodiment, the grain orientation layer is a dielectric layer. For instance, the grain orientation layer may consist of or comprise at least one of the following materials: silicon nitride (SiN) or silicon carbide (SiC).

According to an illustrative embodiment, the predetermined grain orientation distribution after the annealing of the metal feature is less random than a grain orientation before the annealing of the metal feature. According to an illustrative embodiment, being "less random" corresponds to "having a percentage of grains in the metal feature which have a predetermined grain orientation." According to one illustrative embodiment, the predetermined grain orientation distribution comprises a single predominant grain orientation.

Another illustrative embodiment of a method comprises forming a dielectric layer over the grain orientation layer, e.g., in contact with the dielectric layer. That is, the grain orientation layer may be maintained and subsequent metallization layers comprising metal features in respective dielectric layers may be formed above the grain orientation layer. According to a further illustrative embodiment, the grain orientation layer is a functional layer assisting in the formation of a subsequently deposited metallization layer. For example, the grain orientation layer may be formed of a material that is suitable for acting as an etch stop layer for material layers, e.g., dielectric layers formed above the grain orientation layer.

Another illustrative embodiment of a method comprises selectively removing the grain orientation layer after the annealing of the metal feature. This may be suitable if the grain orientation layer is metallic or, in the case of a dielectric grain orientation layer, if a capacitance impact of the grain orientation layer would be too high.

According to another illustrative embodiment, grain orientation layer material of the grain orientation layer which has diffused into the metal feature is removed during removal of the grain orientation layer. Diffusion of grain orientation layer material into the metal feature may occur during the annealing of the metal feature.

The metallization layer may be formed by any appropriate technique. For example, the substrate may comprise a dielectric material layer having a recess. Providing a substrate having a metallization layer with a metal feature in the sense of the subject matter disclosed herein comprises depositing a metal feature material in the recess by overfilling the recess with the metal feature material. Accordingly, metal feature material is formed above a surface of the dielectric material. Depositing metal feature material may be performed by any suitable technique, e.g., by plating, sputtering, etc. It should be understood that additional layers may be formed between the metal feature material and the dielectric material layer, e.g., at least one of adhesion layers, barrier layers, etc. A further illustrative embodiment comprises planarizing the substrate after depositing the metal feature material, thereby removing metal feature material extending above the surface of the dielectric material, e.g., by a chemical mechanical polishing process. Subsequently, the grain orientation layer is formed above and in contact with the metal feature.

According to one illustrative embodiment, the grain orientation layer is deposited by employing deposition parameters such that the grain orientation layer has a predominant grain orientation. According to a still further illustrative embodiment, the grain orientation layer has an elastic modulus which is higher than an elastic modulus of the metal feature, at least during the annealing of the metal feature. According to a still further illustrative embodiment, a hardness of the grain orientation layer is greater than a hardness of the metal feature. This may provide less plastic deformation during the annealing of the metal feature and may lead to a stress level in the annealed metal feature which is reduced compared to an annealed metal feature without grain orientation layer.

According to one illustrative embodiment, the term "at least one metal feature" includes at least one metal line. According to a still further illustrative embodiment, the term "at least one metal feature" comprises at least one via plug for electrically connecting metal features, e.g., metal lines of two different levels. According to a still further illustrative embodiment, the term "at least one metal feature" includes at least one metal line as well as at least one via plug, for instance in a dual damascene scheme.

Figure 2A:
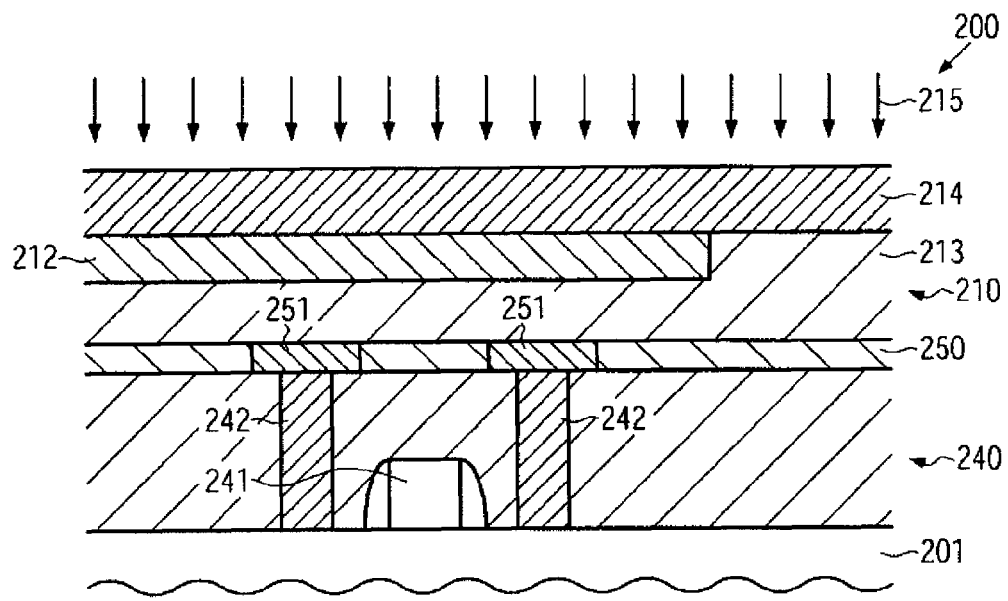
FIGS. 2a-2c schematically show cross-sectional views of a semiconductor device comprising a copper-based metallization layer during different manufacturing stages in accordance with illustrative embodiments of the subject matter disclosed herein.

FIG. 2a schematically illustrates a cross-sectional view of a semiconductor device 200 in accordance with illustrative embodiments of the subject matter disclosed herein, which may comprise a substrate 201 that represents any appropriate substrate for the formation of semiconductor devices. For example, the substrate 201 may represent a bulk silicon substrate, an SOI-like (silicon-on-insulator) substrate, a germanium (Ge) substrate, a gallium-arsenide (GaAs) substrate, or any other appropriate carrier material for having formed thereon respective crystalline or amorphous semiconductor layers for fabricating circuit elements, such as transistors, capacitors, resistors and the like. Consequently, the semiconductor device 200 may have formed in and on the substrate 201 a device layer 240 which may include a plurality of circuit elements, such as transistors and the like, which are indicated by reference numeral 241, representing, in the present example, a field effect transistor having, in some illustrative embodiments, a gate length of approximately 100 nm and less or even of 50 nm and even less. The device layer 240 may further comprise respective contact plugs 242, which may be directly in contact with the respective portions of the circuit elements 241. The semiconductor device 200 may further comprise a first metallization layer 250 that may represent a first metal line layer including a plurality of metal lines 251 which are directly connected to respective contact plugs 242 according to a specified circuit layout. The metallization layer 250 may include copper-based metal features, that is, respective metal lines therein may be substantially comprised of copper.

A typical process flow for forming the semiconductor device 200 up to the metallization layer 250 as shown in FIG. 2a may comprise the following processes and may also include similar processes as are already explained with reference to FIG. 1. That is, the device layer 240 may be formed on the basis of well-established recipes, wherein design rules for the circuit elements 241 may dictate critical dimensions as small as 100 nm and less or even 50 nm and less. After the formation of the device layer 240, the metallization layer 250 may be formed on the basis of well-established inlaid techniques, including the patterning of the dielectric material and filling of respective trenches with a metal, e.g., a copper-based metal.

Depending on the device requirements, a plurality of further metallization layers may be formed on the basis of established recipes by depositing a dielectric layer by any appropriate technique and subsequently patterning the same on the basis of advanced photolithography and anisotropic etch techniques, wherein a dual inlaid technique or a single inlaid technique may be used. The formation of one exemplary further metallization layer 210 will be considered in more detail below. However, it should be understood that the principles of the subject matter disclosed herein are applicable to any metal feature e.g., metal line or via plug at any level of a semiconductor device. For instance, the via plugs 242 and/or the metal lines 251 may comprise a desired grain structure which has been obtained by employing a grain orientation layer as is disclosed herein.

The further metallization layer 210 may comprise an interlayer dielectric layer 213, in which is formed a plurality of metal features, of which a copper-based metal line 212 is shown in FIG. 2a. The dielectric material of the layer 213 may represent any appropriate dielectric material, such as silicon dioxide, fluorine-doped silicon dioxide, or may be comprised of a low-k dielectric material, wherein the dielectric constant thereof may be as low as 3.0 or even less. After filling in the metal for forming the metal line 212, any excess material, such as excess copper and excess barrier material (not shown), may be removed by any appropriate planarization technique, e.g., electrochemical polishing, chemical mechanical polishing (CMP) and the like.

Thereafter, according to one illustrative embodiment, a grain orientation layer 214 is formed by depositing a respective grain orientation layer material in an orientation layer deposition process 215. The orientation layer deposition process 215 may be of any type which is appropriate for deposition of the desired grain orientation layer 214, e.g., chemical vapor deposition (CVD), physical vapor deposition (PVD), sputtering and the like. According to one illustrative embodiment, a dielectric material, for instance silicon nitride (SiN), is used as grain orientation layer material. According to other embodiments, a conductive material, e.g., tantalum (Ta), beta-tantalum (β-Ta), cobalt (Co), cobalt-based materials and the like, may be deposited as the grain orientation layer 214. Process parameters of the respective orientation layer deposition process 215 are used such that a preferential crystallographic orientation of the grain orientation layer 214 is obtained. For instance, in a PECVD deposition process, during the formation of the grain orientation layer, the deposition parameters may be adjusted such that a strong texture, i.e., grain orientation, is created in the grain orientation layer 214 as deposited. For example, during the deposition, e.g., during the deposition of silicon nitride, the deposition parameters, such as temperature, pressure, ion bombardment and the like, may be respectively adjusted.

Figure 2B:
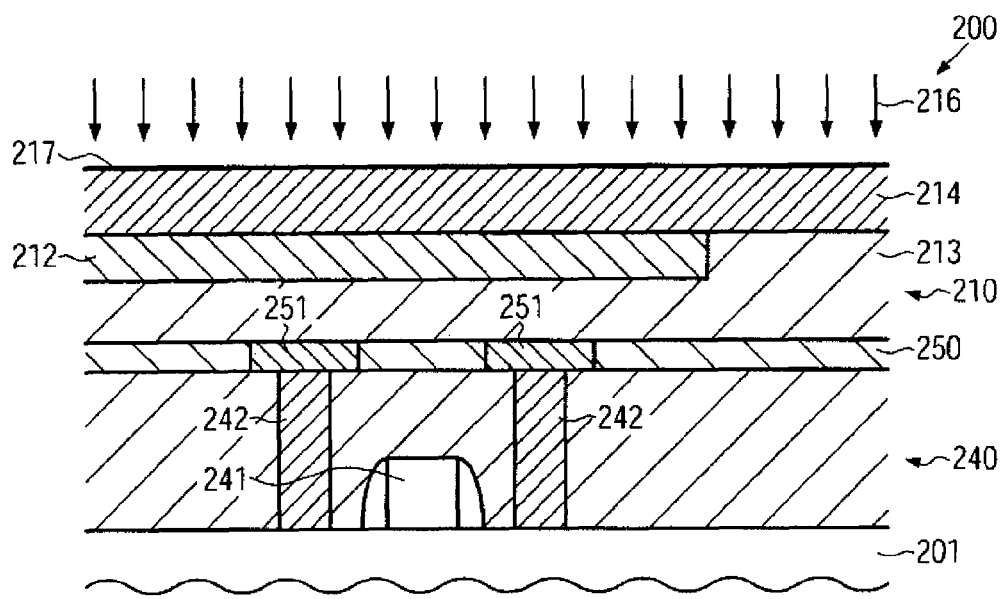

FIG. 2b shows the semiconductor device 200 in a further advanced manufacturing stage in accordance with illustrative embodiments. Herein, the formation of the grain orientation layer 214 has been completed and the semiconductor device 200 is subjected to an annealing process 216 during which the texture of the grain orientation layer 214 promotes the formation of a desired grain orientation in the metal line 212.

Herein, texture refers to the crystallographic texture. A measure for the crystallographic texture may be the percentage of grains which have a preferred orientation. According to one illustrative embodiment, a surface 217 of the semiconductor device 200 which is closest to the metal line 212, i.e., the surface 217 of the grain orientation layer 214 in the depicted embodiment, is subjected to the annealing process 216. According to another illustrative embodiment, the annealing process is designed to act from a backside 218 of the semiconductor device 200 which is opposite the grain orientation layer 214. In this embodiment, the thermal load of the grain orientation layer 214 is low, hence adverse impact of the annealing process on the structure of the grain orientation layer 214 is low. According to other embodiments, the annealing process is designed to act from both planar sides of the semiconductor device 200, i.e., from the surface 217 and the backside 218. According to one illustrative embodiment, the annealing process 216 is a laser annealing process, wherein at least one surface of the semiconductor device is irradiated with an appropriate laser beam, e.g., a continuous laser beam or a pulsed laser beam, to heat the metal feature 212 to a predetermined elevated temperature. According to a further illustrative embodiment, the annealing process 216 employs microwave radiation, which leads to selective heating of the metallic features 212 of the metallization layer 210. According to another illustrative embodiment, the annealing process 216 employs ultrasound. For example, the frequency and distribution of the ultrasound may be adjusted such that the ultrasound is concentrated at the metallic features 214.

Figure 2C:
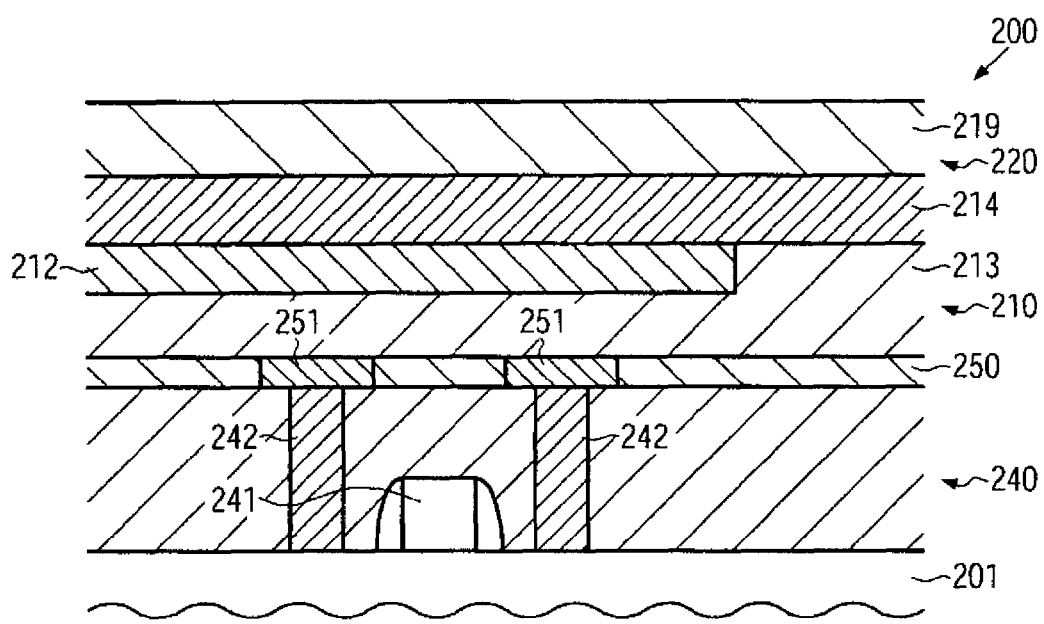

According to one illustrative embodiment, the grain orientation layer 214 may be maintained after annealing of the metallization layer 210. FIG. 2c shows the semiconductor device 200 in a further advanced manufacturing stage in accordance with illustrative embodiments, in which a further dielectric layer 219 of a further metallization layer 220 has been formed above the grain orientation layer 214. The dielectric layer 219 may be deposited, for instance, by PECVD or any other suitable process. The dielectric layer 219, which is to receive vias for forming a further via layer of the semiconductor device 200, may be comprised of any appropriate dielectric material, such as, for instance, fluorine-doped silicon dioxide, silicon dioxide or even a low-k dielectric material.

According to one illustrative embodiment, the grain orientation layer 214 is made of an appropriate dielectric material, which may be used as a functional layer assisting in the formation of a subsequently deposited metallization layer 220. For example, the grain orientation layer 214 may be used as a barrier/etch stop layer. In this embodiment, the grain orientation layer 214 may suppress any interdiffusion between the overlying dielectric layer 219 and the copper-based material in the line 212. Moreover, the grain orientation layer 214 may exhibit a high etch selectivity with respect to an anisotropic etch process for patterning the dielectric layer 219 in a subsequent etch process (not shown). The dielectric layer 219 may be patterned on the basis of photolithography and anisotropic etch techniques so as to etch through the dielectric layer 219 and subsequently opening the etch stop layer/grain orientation layer 214 for providing a direct connection to the metal line 212. Next, a conductive barrier layer and a seed layer may be deposited in the etched recess in order to prepare the device 200 for the deposition of a copper-based metal.

According to illustrative embodiments, the grain orientation layer 214 may be comprised of silicon nitride, silicon carbide, nitrogen-enriched silicon carbide and the like. It should be appreciated that in other embodiments the grain orientation layer 214 may be removed or may be replaced by other materials that may provide the desired characteristics. For example, in some embodiments, it may be considered appropriate to form a corresponding conducting surface layer within the metal line 212 which may exhibit a high resistance against diffusion and oxygen diffusion or diffusion of other unwanted materials that may readily react with copper. For example, an appropriate copper alloy or other metal feature material or dielectric material may be provided on top of the metal line 212.

Figure 3A:
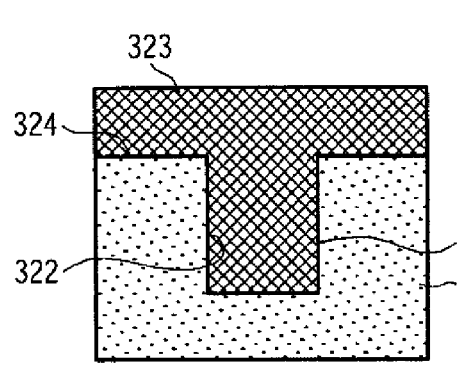
FIGS. 3a-3f schematically show cross-sectional views of a semiconductor device comprising a copper-based metallization layer during different manufacturing stages in accordance with further illustrative embodiments of the subject matter disclosed herein.

FIGS. 3a-3e show a semiconductor device 300 according to illustrative embodiments of the subject matter disclosed herein in various manufacturing stages. FIG. 3a shows a semiconductor device 300 having a dielectric layer 313. The dielectric layer 313 comprises a recess 322 which has been filled with a metal feature material 323, for instance, copper or a copper alloy, to provide a metal feature 312, like a metal line, as shown in FIG. 3a. The recess 322 has been overfilled with the metal feature material 323. The metal feature material may be deposited by, e.g., CVD, sputtering, plating, etc. For instance, with regard to copper as the metal feature material 323, plating, e.g., electroless plating or electroplating, is commonly employed as the metal feature material deposition process. It should be understood that the recess 322 may be covered with one or more additional layers (not shown), e.g., barrier layers or seed layers. By overfilling the recess 322, metal feature material 323 is deposited on a surface 324 of the dielectric layer 313.

Figure 3B:
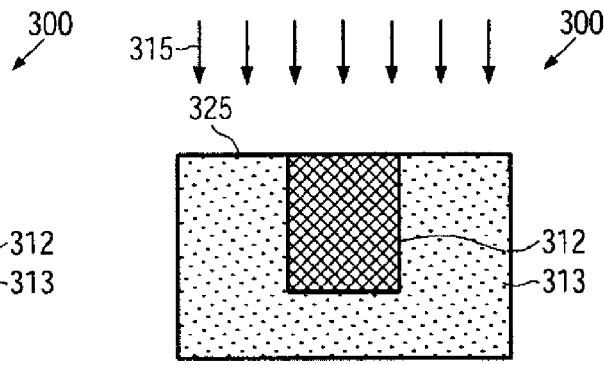

FIG. 3b shows the semiconductor device 300 in a further advanced manufacturing stage, wherein excess metal feature material 323 has been removed, e.g., by chemical polishing or by chemical mechanical polishing (CMP). Hence, the polishing process yields a laid-in metal line 312 and a polished surface 325 having portions of the metal feature material 323 and portions of the dielectric layer 313 which is free of metal feature material 323. A grain orientation layer deposition process 315 is carried out to deposit a grain orientation layer (not shown in FIG. 3b) on the polished, planarized surface 325 of the semiconductor device 300. The inventors have found that the grain orientation of small features in copper interconnects depends mostly on the orientation of deposited bulk copper, i.e., the copper which has been deposited above the dielectric material 324. The big bulk grains grow into the small features and this grain structure will remain after the bulk copper is removed (FIG. 3b). The grain orientation of the copper in the small features was found to be highly random.

Figure 3C:
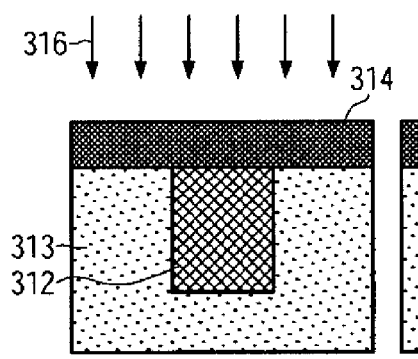

FIG. 3c shows the semiconductor device 300 in a further advanced manufacturing stage in accordance with illustrative embodiments of the subject matter disclosed herein. In FIG. 3c, the grain orientation layer deposition process 315 has been completed and a grain orientation layer 314 has been formed. The semiconductor device shown in FIG. 3c is subjected to an anneal process 316. The anneal process 316 may be of any appropriate type, e.g., of a type as disclosed with regard to FIG. 2b.

Figure 3D:
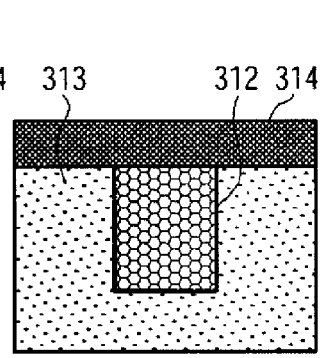

FIG. 3d shows the semiconductor device 300 in a further advanced manufacturing stage, wherein the anneal process 316 has been completed and the metal feature 312 of the semiconductor device 300 exhibits the desired grain orientation. According to one illustrative embodiment, the grain orientation after the anneal process 316 (FIG. 3d) is less random than the grain orientation before the anneal process 316 (FIG. 3c). According to a further embodiment, wherein the metal feature material of the metal feature 312 is copper or a copper-containing alloy, one grain orientation of the metal feature grains, e.g., copper grains in an illustrative embodiment, is preferred in contact with the grain orientation layer. A less random grain orientation may have a positive impact on the reliability of the copper interconnects. After the annealing process 316, the metal feature grains, i.e., the copper grains in an illustrative embodiment, of the interconnects are aligned with respect to the grain orientation layer.

According to one illustrative embodiment, the grain structure of the grain orientation layer 314 may be more coarse, i.e., may have an increased average grain diameter, compared to the grain structure of the metal feature. According to another illustrative embodiment, a typical grain size of the grain orientation layer 314 may be larger than the smallest surface feature size of the metal feature. According to other embodiments, the typical grain size of the grain orientation layer 314 may be smaller than the typical grain size of the metal feature.

According to a further embodiment, the grain orientation layer 314 mechanically stabilizes the metal feature. For example, according to an illustrative embodiment of the subject matter disclosed herein, the grain orientation layer has an elastic modulus which is higher than an elastic modulus of the metal feature. In embodiments where the metal feature 312 and the dielectric layer 313 have different coefficients of thermal expansion, the higher elastic modulus of the grain orientation layer may provide the generation of mechanical stresses in the metal feature 312 during heating to an elevated annealing temperature. Further, according to other illustrative embodiments, a hardness of the grain orientation layer 314 may be greater than a hardness of the metal feature 312. Having different coefficients of thermal expansion for the metal feature 312 and the dielectric layer 313, the higher hardness of the grain orientation layer may provide the generation of mechanical stresses in the metal feature 312 during heating to an elevated annealing temperature. Without being bound to theory, it is assumed that such mechanical stresses may increase the energetic state of the metal feature 312 during annealing and may support the formation of a less random grain orientation distribution in the metal feature 312.

Figure 3E:
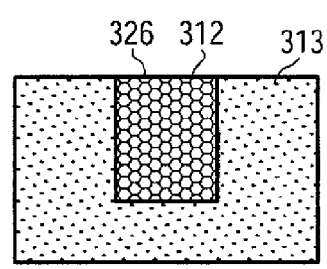

FIG. 3e shows the semiconductor device 300 in an optional, further advanced manufacturing stage, wherein, in accordance with one illustrative embodiment, the grain orientation layer 314 has been removed, e.g., by a polishing process, e.g., by chemical polishing or by chemical mechanical polishing. According to one illustrative embodiment, grain orientation layer material of the grain orientation layer 314 which may have been diffused into the metal feature 312 is removed, e.g., according to one illustrative embodiment, during removing of the grain orientation layer 314. This provides a metal feature 312 that is free of grain orientation layer material. According to other embodiments, grain orientation layer material diffused into the metal feature 312 is removed by a separate removal process, e.g., an etch process. As described with regard to FIG. 2c, the grain orientation layer 314 may be removed if, according to an illustrative embodiment, the grain orientation layer 314 is conductive, e.g., metallic. Further, the grain orientation layer 314 may be removed if, according to a further illustrative embodiment, the grain orientation layer consists of a dielectric material which has a high capacitance impact on the metal features of the metallization layer. Further, the grain orientation layer 314 may be removed to allow the formation of a further material layer in contact with the surface 326 of the metal feature 312 which is exposed by the removal of the grain orientation layer. According to other illustrative embodiments, the grain orientation layer 314 may be maintained, e.g., if the grain orientation layer is, according to one illustrative embodiment, a functional layer assisting in the formation of a subsequently deposited metallization layer, as described with regard to FIG. 2c.

Figure 3F:
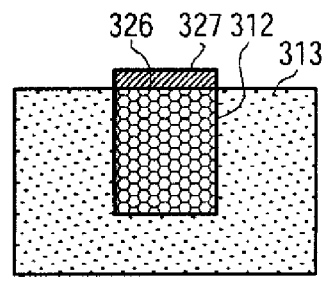

FIG. 3f shows the semiconductor device 300 in an optional, further advanced manufacturing stage in accordance with illustrative embodiments of the subject matter disclosed herein. In FIG. 3f, a capping layer 327 has been deposited on the upper surface 326 of the metal feature 312 according to well-established techniques and recipes. The capping layer 327 may improve the electromigration behavior of the metal feature 312 and may be formed of any appropriate material, e.g., a cobalt-based material such as cobalt tungsten phosphide (CoWP), cobalt tungsten boride (CoWB), etc. The improved electromigration behavior has been attributed to a higher adhesion energy of CoWP to copper compared to an adhesion energy of a dielectric material to copper. According to one illustrative embodiment, the capping layer has an adhesion energy to copper greater than 20 watts per square meter ($W/m^2$) and according to a further illustrative embodiment has an adhesion energy greater than 25 watts per square meter ($W/m^2$). CoWP may be deposited in a well-established selective electroless deposition process. Such a selective deposition process has the advantage that no etching process is necessary for patterning. According to other illustrative embodiments, the capping layer 327 prevents the metal feature 312 from oxidation. For example, the capping layer may be formed of silicon nitride (SiN) or silicon carbide (SiC) for this purpose.

Figure 4A:
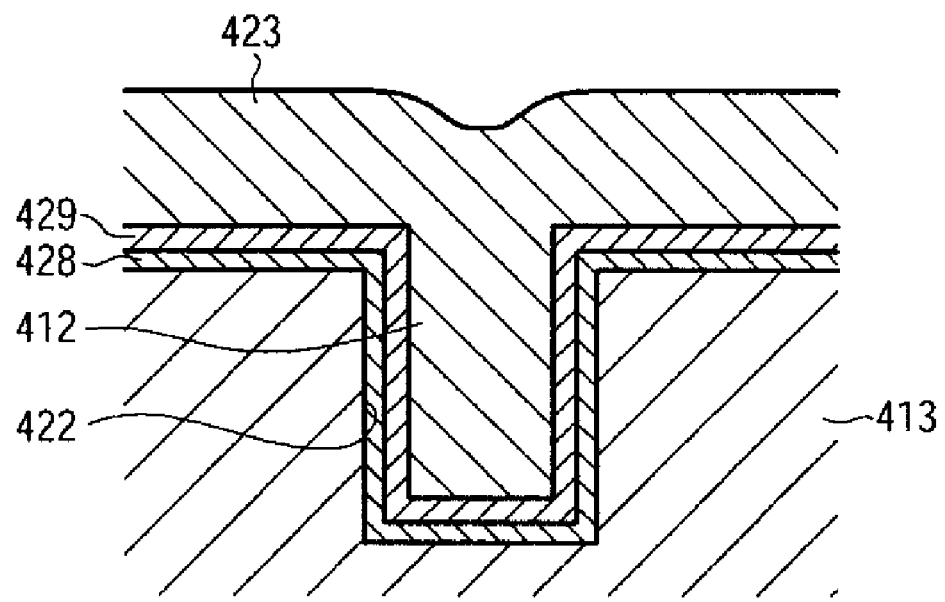
FIGS. 4a-4b schematically show cross-sectional views of a semiconductor device comprising a copper-based metallization layer during different manufacturing stages in accordance with further illustrative embodiments of the subject matter disclosed herein.

FIG. 4a schematically shows a semiconductor device 400 in accordance with illustrative embodiments of the subject matter disclosed herein. A metal feature material 423, of which is formed at least one of a via plug and a metal line, of which a metal line 412 is shown in FIG. 4a, may be deposited as described below. According to one illustrative embodiment, the metal feature material 423 is copper or a copper alloy. In accordance with well-established damascene processes, a recess 422 is formed in a dielectric layer 413 of the semiconductor device 400. The recess 422 may be covered with a barrier layer 428 that prevents diffusion of the copper into the dielectric layer 413. The barrier layer 428, which is typically comprised of at least one of tantalum (Ta), tantalum nitride (TaN), titanium (Ti), titanium nitride (TiN), tungsten (W) and tungsten nitride (WN), may be applied by, e.g., a CVD process, for instance a PECVD process. Subsequently, a copper seed layer 429 may be deposited on the barrier layer 428 according to well-established techniques, e.g., CVD techniques and recipes. In an electroplating technique, the copper seed layer 429 may serve as an electrode for electroplating copper on the copper seed layer, thereby filling the recess 422 with copper. Metal feature material 423 is also deposited above the dielectric layer 413. According to alternative embodiments, the metal feature material 423 may be deposited, for instance, by chemical vapor deposition (CVD) or physical vapor deposition (PVD). FIG. 4a schematically shows the semiconductor device 200 after the completion of the above-described process sequence and after the electrochemical deposition of the copper-based layer 423, which may be formed on the seed layer 429, which, in turn, may be formed on an appropriate barrier layer 428.

Figure 4B:
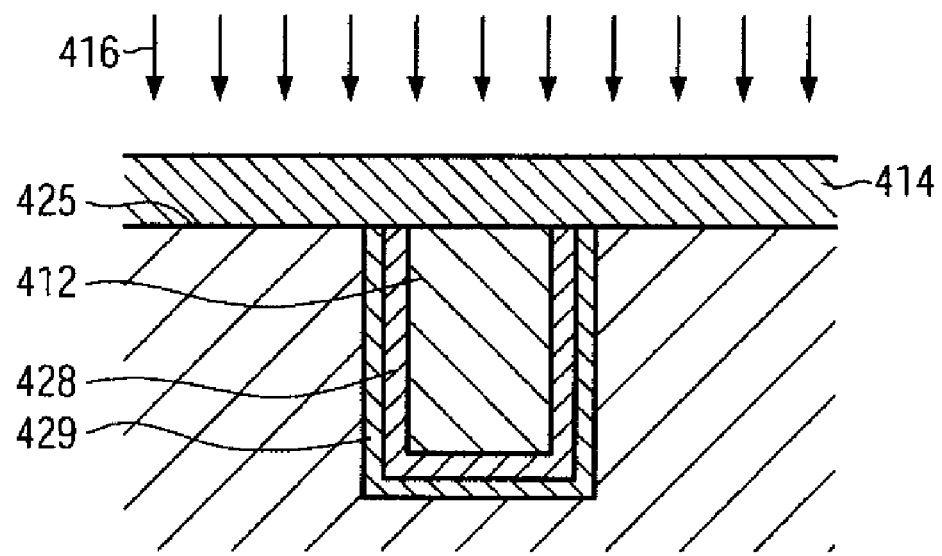

FIG. 4b shows the semiconductor device 400 in a further advanced manufacturing stage in accordance with illustrative embodiments. In the manufacturing stage shown in FIG. 4b, the excess material, i.e., the excess material of the layer 423 and of the layers 228 and 229, has been removed by, for instance, CMP, possibly in combination with electrochemical etch techniques, thereby providing a planarized surface topography. A grain orientation layer 414 has been deposited on the planarized surface 425. The grain orientation layer 414 may be formed of a material and according to processes as discussed with regard to the grain orientation layers 214, 314.

According to one illustrative embodiment, the copper seed layer 429, the barrier layer 428 and the grain orientation layer 414 are configured to act together to promote a predetermined grain orientation of the metal feature 412 in a subsequent annealing process 416. The annealing process 416 may be selected as described herein before with regard to the annealing processes 216, 316.

According to one illustrative embodiment, the grain orientation layer 414 may be maintained during further processing of the semiconductor device 400. According to other illustrative embodiments, the grain orientation layer 414 is removed from the semiconductor device 400, for instance, by wet or dry etching or by polishing, e.g., chemical mechanical polishing. If the grain orientation layer 414 is removed, the surface 426 of the metal feature 412 may be optionally covered with a cover layer as described with regard to FIG. 3f.

As a result, the subject matter disclosed herein provides a semiconductor device and a manufacturing process in which a significant improvement with respect to grain orientation in metal features, and thus reliability of the metal features, may be achieved for sophisticated semiconductor devices requiring a copper-based metallization scheme, i.e., employing a metal feature material which comprises copper. According to other illustrative embodiments, the metal feature material may be free of copper. A less random grain orientation distribution in metal features of a semiconductor device, e.g., a grain orientation distribution which has a higher percentage of grains that have a predetermined grain orientation, is generated by employing a grain orientation layer. For instance, the grain orientation layer may be deposited on the metal features, wherein the desired grain structure of the metal features is obtained by a subsequent annealing process, during which the metal feature is in contact with the grain orientation layer. The grain orientation layer may be of any appropriate kind, including dielectric layers, metal layers, etc. According to one illustrative embodiment, the grain structure of the grain orientation layer may be more coarse compared to the grain structure of the metal feature. According to another illustrative embodiment, a typical grain size of the grain orientation layer may be larger than the smallest surface feature size of the metal feature. According to other embodiments, the typical grain size of the grain orientation layer may be smaller than the typical grain size of the metal feature. After the annealing process which provides the desired grain structure, the grain orientation layer may be selectively removed. In such a case, the surface of the metal feature may be selectively covered with a capping layer that prevents oxidation of the metal feature surface. According to illustrative embodiments, the capping layer improves the electromigration behavior of the metal feature.

It should be understood that the invention is applicable to front-end of the line metallization layers as well as to back-end of the line metallization layers. For example, any of the above-mentioned illustrative embodiments may be employed to form contact plugs contacting contact regions of a device or may be employed to form metal lines and via plugs of metallization layers formed thereover. It should further be understood that, in cases where reference is made to particular features like metal lines or vias, these features are only examples of a metal feature and may be replaced by any metal feature of a semiconductor device. It should be understood that any example given in this detailed description which refers to a single damascene process may also be employed in conjunction with a dual damascene process. Herein, via plugs and metal lines may be formed in a single dielectric layer or may be formed in separate dielectric layers, as explained with regard to FIG. 1.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a substrate having a metallization layer with at least one metal feature, wherein said substrate comprises a dielectric material layer having a recess and providing a substrate having a metallization layer comprises depositing a metal feature material in said recess by overfilling said recess with said metal feature material, thereby depositing metal feature material above a surface of said dielectric material and planarizing said substrate after depositing said metal feature material, thereby removing metal feature material extending above said surface of said dielectric material;
forming a grain orientation layer above said metal feature and in direct contact with said metal feature after planarizing said substrate, wherein said grain orientation layer comprises a material different than said metal feature;
annealing said metal feature after forming said grain orientation layer to thereby increase a percentage of grains in said metal feature which have said predetermined grain orientation, wherein, during said annealing, said grain orientation layer energetically favors a predetermined grain orientation of grains in said metal feature compared to other grain orientations of grains in said metal feature; and
selectively removing said grain orientation layer after said annealing of said metal feature, wherein grain orientation layer material of said grain orientation layer diffused into said metal feature is completely removed during the removing of said grain orientation layer.

2. The method of claim 1, wherein said metal feature comprises copper.

3. The method of claim 1, wherein said grain orientation layer is a metal layer.

4. The method of claim 1, wherein said grain orientation layer is a dielectric layer.

5. The method of claim 1, further comprising forming a capping layer over said metal feature after removing said grain orientation layer.

6. The method of claim 1, wherein the grain orientation layer is deposited by employing deposition parameters such that said grain orientation layer has a predominant grain orientation.

7. The method of claim 1, wherein, during said annealing, the grain orientation layer has an elastic modulus which is higher than an elastic modulus of said metal feature.

8. The method of claim 1, wherein, during said annealing, a hardness of said grain orientation layer is greater than a hardness of said metal feature.

9. The method of claim 1, wherein said at least one metal feature comprises a metal line.

10. The method of claim 1, wherein said at least one metal feature comprises a via plug for electrically connecting metal features of two different levels.

* * * * *